(12) United States Patent
Longnos et al.

(10) Patent No.: US 11,237,762 B2
(45) Date of Patent: Feb. 1, 2022

(54) INFORMATION WRITING METHOD AND APPARATUS

(71) Applicant: Huawei Technologies Co., Ltd., Shenzhen (CN)

(72) Inventors: Florian Longnos, Shenzhen (CN); Feng Yang, Shenzhen (CN); Wei Yang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 56 days.

(21) Appl. No.: 16/805,192

(22) Filed: Feb. 28, 2020

(65) Prior Publication Data

US 2020/0201577 A1 Jun. 25, 2020

Related U.S. Application Data

(63) Continuation of application No. PCT/CN2017/100098, filed on Aug. 31, 2017.

(51) Int. Cl.
*G06F 3/06* (2006.01)
*G06F 13/16* (2006.01)

(52) U.S. Cl.
CPC .......... *G06F 3/0659* (2013.01); *G06F 3/0604* (2013.01); *G06F 3/0625* (2013.01); *G06F 3/0679* (2013.01); *G06F 13/1668* (2013.01)

(58) Field of Classification Search
CPC .... G06F 3/0659; G06F 3/0604; G06F 3/0625; G06F 3/0679; G06F 13/1669
See application file for complete search history.

(56) References Cited

U.S. PATENT DOCUMENTS

| | | | |
|---|---|---|---|
| 7,003,621 B2* | 2/2006 | Koren | G11C 16/102 365/185.33 |
| 10,185,509 B1* | 1/2019 | Farhan | G06F 3/0611 |
| 2007/0133296 A1 | 6/2007 | Ning | |
| 2009/0172251 A1* | 7/2009 | Norman | G11C 16/22 711/103 |
| 2012/0131253 A1 | 5/2012 | McKnight et al. | |
| 2013/0036256 A1 | 2/2013 | Kawamura | |
| 2014/0013040 A1 | 1/2014 | Yamashita | |
| 2014/0149642 A1 | 5/2014 | Li | |

(Continued)

FOREIGN PATENT DOCUMENTS

| | | |
|---|---|---|
| CN | 102193747 A | 9/2011 |
| CN | 102402464 A | 4/2012 |
| CN | 102890617 A | 1/2013 |

(Continued)

*Primary Examiner* — Idriss N Alrobaye
*Assistant Examiner* — Richard B Franklin
(74) *Attorney, Agent, or Firm* — Conley Rose, P.C.

(57) ABSTRACT

An information writing method is applied to an non-volatile dual in-line memory module (NVDIMM), the NVDIMM includes an NVDIMM controller and a non-volatile memory (NVM), and the method includes receiving, by the NVDIMM controller, a sanitize command from a host, where the sanitize command is used to instruct the NVDIMM controller to sanitize data in the NVM using a first write pattern, and the first write pattern is one of at least two patterns of writing information into the NVM, and writing, by the NVDIMM controller, information into the NVM according to the sanitize command.

20 Claims, 7 Drawing Sheets

(56) References Cited

U.S. PATENT DOCUMENTS

2017/0153826 A1 6/2017 Cho et al.
2017/0168931 A1 6/2017 Kim et al.

FOREIGN PATENT DOCUMENTS

| CN | 103533202 A | 1/2014 |
| CN | 104461964 A | 3/2015 |
| CN | 104598168 A | 5/2015 |
| CN | 106527992 A | 3/2017 |
| CN | 106997324 A | 8/2017 |
| EP | 2876574 A1 | 5/2015 |

\* cited by examiner

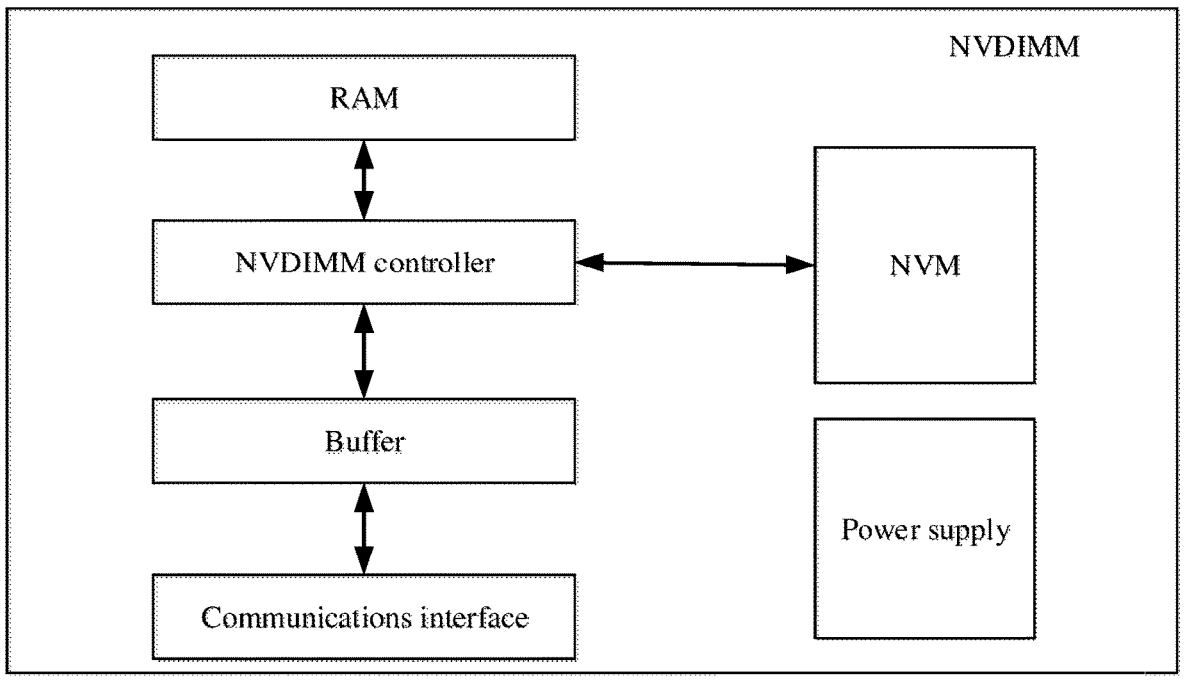

An NVDIMM controller receives a sanitize command from a host, where the sanitize command is used to instruct the NVDIMM controller to sanitize data in an NVM by using a first write pattern, and the first write pattern is one of at least two patterns of writing information into the NVM — S201

The NVDIMM controller writes information into the NVM according to the sanitize command — S202

FIG. 2

INFORMATION WRITING METHOD AND APPARATUS

CROSS-REFERENCE TO RELATED APPLICATIONS

This application is a continuation application of International Patent Application No. PCT/CN2017/100098, filed on Aug. 31, 2017, the disclosure of which is hereby incorporated by reference in its entirety.

TECHNICAL FIELD

This application relates to the computer field, and in particular, to an information writing method and apparatus.

BACKGROUND

A non-volatile dual in-line memory module (NVDIMM) is a memory that integrates a random access memory (RAM) and a non-volatile memory (NVM). The NVDIMM includes different products. An NVDIMM-P is an NVDIMM that has appeared recently. A typical NVDIMM-P includes a memory bus, a controller, a dynamic random access memory (DRAM), and a flash memory.

In comparison with a dual in-line memory module (DIMM), data stored in the NVDIMM includes persistent data. In this case, a data loss can be avoided when a power failure occurs on a host, improving reliability of the host. However, the persistent data stored in the NVDIMM may be easily thieved. Therefore, the NVDIMM increases a security risk while improving the reliability of the host. In addition, storage performance of a flash memory degrades due to long-term reading and writing of the persistent data. For example, memory leak occurs on the flash memory due to long-term reading and writing of the flash memory. To resolve the foregoing problem, a sanitize operation needs to be performed on the persistent data in the NVDIMM. Before the sanitize operation is performed, data that needs to be stored in the NVM has been stored in another memory. For example, the other memory is a solid state disk (SSD). In this case, information stored in the NVM is useless information, and all information stored in the NVM can be sanitized using the sanitize operation. All the information includes user data and metadata such that a storage status of the NVM is changed to an initial status, and the foregoing problem is resolved.

However, in other approaches, a problem of relatively high power consumption exists when the sanitize operation is performed on the persistent data in the NVDIMM. How to reduce power consumption during the sanitize operation is a problem that currently needs to be resolved urgently.

SUMMARY

This application provides an information writing method and apparatus, to resolve the foregoing problems.

According to a first aspect, an information writing method is provided and applied to an NVDIMM. The NVDIMM includes an NVDIMM controller and an NVM. The method includes receiving, by the NVDIMM controller, a sanitize command from a host, where the sanitize command is used to instruct the NVDIMM controller to sanitize data in the NVM using a first write pattern, and the first write pattern is one of at least two patterns of writing information into the NVM, and writing, by the NVDIMM controller, information into the NVM according to the sanitize command.

Optionally, the information that is written by the NVDIMM controller according to the instruction of the sanitize command is the same as information that is written into the NVM in a power-saving write pattern.

Optionally, the receiving, by the NVDIMM controller, a sanitize command from a host includes receiving, by the NVDIMM controller, the sanitize command from the host using a command bus.

Optionally, the method further includes setting, by the NVDIMM controller, a sanitizing status to a readable state, where the readable state indicates that the host is allowed to track execution of the sanitize command.

Optionally, before the receiving, by the NVDIMM controller, a sanitize command from a host, the method further includes receiving, by the NVDIMM controller, a first check command from the host, where the first check command is used to instruct the NVDIMM controller to check whether an uncompleted read and/or write request exists in a buffer, checking, by the NVDIMM controller, the buffer according to the first check command, sending, by the NVDIMM controller, a first check result to the host, where the first check result is used to indicate that no uncompleted read and/or write request exists in the buffer, receiving, by the NVDIMM controller, a second check command from the host, where the second check command is used to instruct the NVDIMM controller to check whether an uncompleted write request exists in a controller of the NVM, checking, by the NVDIMM controller, the controller of the NVM according to the second check command, and sending, by the NVDIMM controller, a second check result to the host, where the second check result is used to indicate that no uncompleted write request exists in the controller of the NVM.

Optionally, the sanitize command is a command code in the NVDIMM-P protocol for a double data rate 5 (DDR5) interface, or the sanitize command is a command code in the NVDIMM-P protocol for a double data rate 4 (DDR4) interface.

According to a second aspect, an information writing method is provided and applied to an NVDIMM. The NVDIMM includes an NVDIMM controller and an NVM. The method includes generating, by a host, a sanitize command, where the sanitize command is used to instruct the NVDIMM controller to sanitize data in the NVM using a first write pattern, and the first write pattern is one of at least two patterns of writing information into the NVM, and sending, by the host, the sanitize command to the NVDIMM controller.

Optionally, the generating, by a host, a sanitize command includes generating, by the host, the sanitize command based on a type of the NVM, where the information that is written by the NVDIMM controller according to the instruction of the sanitize command is the same as information that is written into the NVM in a power-saving write pattern.

Optionally, the sending, by the host, the sanitize command to the NVDIMM controller includes sending, by the host, the sanitize command to the NVDIMM controller using a command bus.

Optionally, the method further includes sending, by the host, a tracking command to the NVDIMM controller, where the tracking command is used to track execution of the sanitize command.

Optionally, the method further includes sending, by the host, a first check command to the NVDIMM controller, where the first check command is used to instruct the NVDIMM controller to check whether an uncompleted read and/or write request exists in a buffer, receiving, by the host, a first check result from the NVDIMM controller, where the first check result is used to indicate that no uncompleted read and/or write request exists in the buffer, sending, by the host, a second check command to the NVDIMM controller, where the second check command is used to instruct the NVDIMM controller to check whether an uncompleted write request exists in a controller of the NVM, and receiving, by the host, a second check result from the NVDIMM controller, where the second check result is used to indicate that no uncompleted write request exists in the controller of the NVM, and the sending, by the host, the sanitize command to the NVDIMM controller includes sending, by the host, the sanitize command to the NVDIMM controller based on the first check result and the second check result.

Optionally, the sanitize command is a command code in the NVDIMM-P protocol for a DDR5 interface, or the sanitize command is a command code in the NVDIMM-P protocol for a DDR4 interface.

According to a third aspect, an information writing apparatus is provided, where the apparatus can implement functions performed by the NVDIMM controller in the method of the first aspect, and the functions may be implemented by hardware, or may be implemented by hardware executing corresponding software. The hardware or software includes one or more units or modules that correspond to the foregoing functions. In a possible design, the apparatus is a chip.

According to a fourth aspect, an information writing apparatus is provided, where the apparatus can implement functions performed by the host in the method of the second aspect, and the functions may be implemented by hardware, or may be implemented by hardware executing corresponding software. The hardware or software includes one or more units or modules that correspond to the foregoing functions. In a possible design, the apparatus is a chip.

According to a fifth aspect, this application further provides a computer system, where the computer system includes the information writing apparatus of the third aspect and the information writing apparatus of the fourth aspect.

According to a sixth aspect, this application further provides a computer program product, where the computer program product includes computer program code, and when the computer program code is run by an NVDIMM controller, the NVDIMM controller performs the method of the first aspect.

According to a seventh aspect, this application provides a computer program product, where the computer program product includes computer program code, and when the computer program code is run by a host, the host performs the method of the second aspect.

BRIEF DESCRIPTION OF DRAWINGS

FIG. 1 is a schematic structural diagram of an NVDIMM applicable to this application.

FIG. 2 is a schematic diagram of an information writing method according to this application.

DESCRIPTION OF EMBODIMENTS

Figure 3:
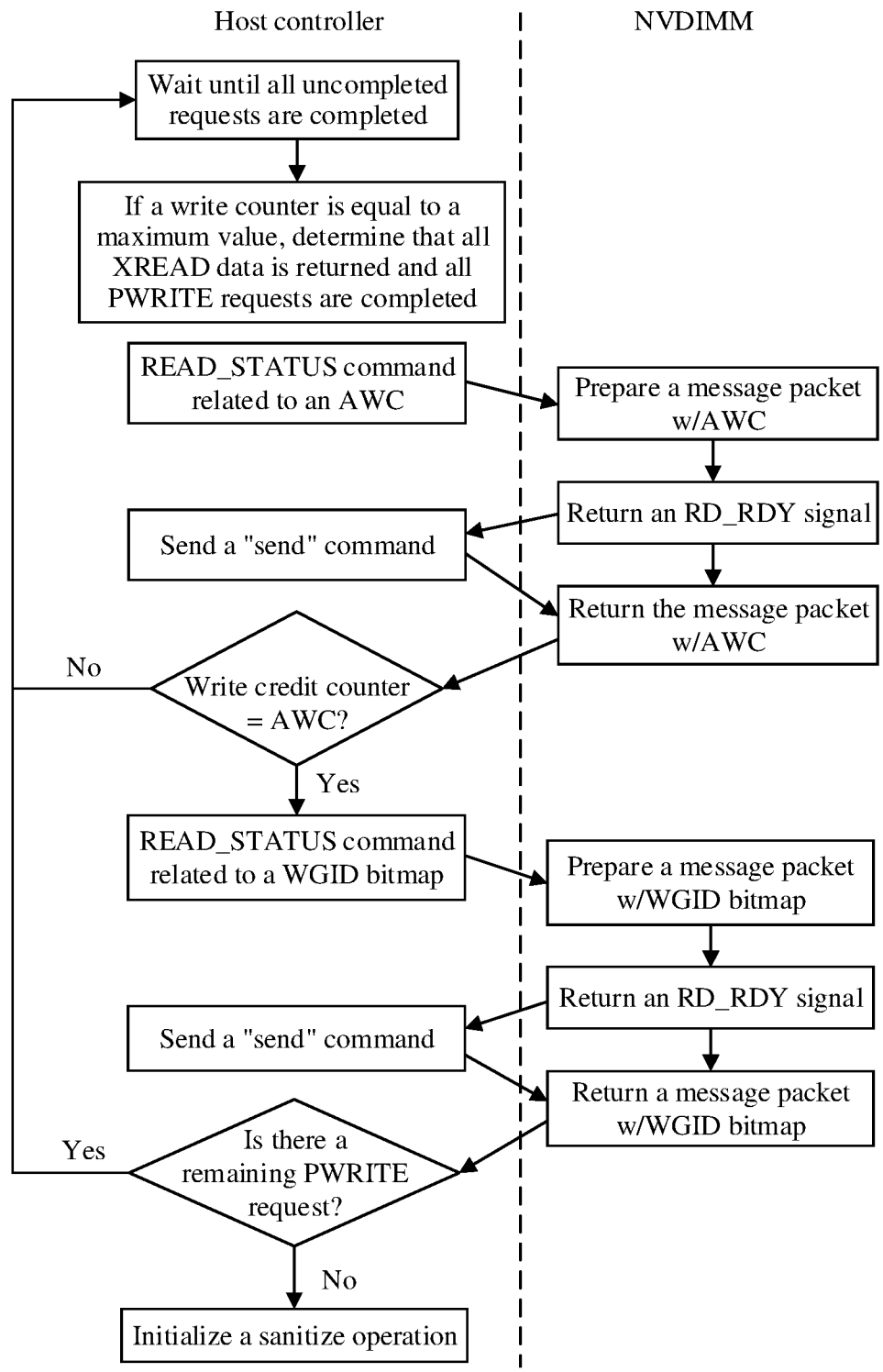
FIG. 3 is a schematic flowchart of a method for preparing a sanitize operation according to this application.

The following describes technical solutions of this application with reference to the accompanying drawings.

FIG. 1 shows an NVDIMM applicable to this application. As shown in FIG. 1, the NVDIMM includes a controller, a buffer, a RAM, an NVM, a communications interface, and a power supply. The NVDIMM may further include a cache. When the NVDIMM includes a cache, the cache may be integrated into the NVDIMM, or may be integrated into the controller. The controller may separately communicate with the RAM and the NVM. The controller may further communicate with a processor or another module using the communications interface. A host may read data from the buffer or write data into the buffer using the communications interface. The power supply is used to supply power to the NVDIMM such that the NVDIMM can store data into the NVM when a power failure occurs on the host. For example, the communications interface is an interface that complies with the DDR4 standard, and such an interface is referred to as a DDR4 interface for short, alternatively, the communications interface may be an interface that complies with the DDR5 standard, and such an interface is referred to as a DDR5 interface for short. Correspondingly, when accessing the RAM or the NVM, the controller reads data using the DDR4 interface or the DDR5 interface.

The RAM has high read and write rates, and is used to store non-persistent data. The NVM has low read and write rates, and is used to store persistent data. When the power failure occurs on the host, the host sends a save signal to the NVDIMM controller, instructing the NVDIMM controller to flush data in the RAM into the NVM such that data can be protected when an abnormal power failure occurs.

The NVDIMM shown in FIG. 1 is merely an example for description, and is not limited to an NVDIMM applicable to this application. For example, the buffer may be integrated into the controller, the controller may be integrated into the NVM or the RAM, and the power supply may be an independent component but not a component integrated into the NVDIMM, as shown in FIG. 1. It needs to be noted that the NVM may also have an independent controller, that is, an NVM controller. The NVM controller may be integrated into the NVDIMM controller shown in FIG. 1, may be integrated into the NVM, or may be integrated into the NVDIMM and used as an independent component.

In addition, for example, the RAM may be a DRAM, or may be a static random access memory (SRAM), or may be another type of RAM. For example, the NVM may be a flash memory or)(POINT, or may be another type of NVM. For example, the power supply may be a supercapacitor.

The following describes, in detail using an NVDIMM-P as an example, the information writing method provided in this application.

FIG. 2 shows an information writing method according to this application. The method 200 includes the following steps.

S201. An NVDIMM controller receives a sanitize command from a host, where the sanitize command is used to instruct the NVDIMM controller to sanitize data in an NVM using a first write pattern, and the first write pattern is one of at least two patterns of writing information into the NVM.

S202. The NVDIMM controller writes information into the NVM according to the sanitize command.

In S201, the host may include a central processing unit (CPU), an application-specific integrated circuit (ASIC), or other type of processor, and this is not limited in this application.

It is generally known that an NVM stores data using a status "0" and a status "1". Different types of NVMs have different media. For some media, power consumption during writing "0" is higher than power consumption during writing "1". For other media, power consumption during writing "1" is higher than power consumption during writing "0". Therefore, the host may select a proper write pattern based on a type of an NVM medium.

For example, two write patterns, a first write pattern and a second write pattern, may be defined in the NVDIMM-P protocol. The first write pattern is that "1" is written for all bits, and the second write pattern is that "0" is written for all bits. When power consumption during writing "1" is higher than power consumption during writing "0" for the medium of the NVM in S201, the host may send, to the NVDIMM controller, the sanitize command that indicates the first write pattern in order to reduce power consumption caused when the NVDIMM performs a sanitize operation.

The foregoing embodiment is simple and easy to implement. However, because the NVDIMM may include two or more types of NVMs, in an optional embodiment, in the method 200, the information that is written by the NVDIMM controller according to the instruction of the sanitize command is the same as information that is written into the NVM in a power-saving write pattern.

For example, the NVM includes a first module and a second module. For a medium of the first module, power consumption during writing "1" is higher than power consumption during writing "0" and for a medium of the second module, power consumption during writing "0" is higher than power consumption during writing "1". The first write pattern indicated by the sanitize command in S201 is to write "0" in the first module and write "1" in the second module, thereby reducing the power consumption caused when the NVDIMM performs the sanitize operation.

For another example, the NVDIMM controller may be instructed, using a command code in the NVDIMM-P protocol for a DDR4 interface or a command code in the NVDIMM-P protocol for a DDR5 interface, to write "0" or "1" into the NVM using an 8-bit write pattern. The 8-bit write pattern indicates that eight bits are written into the NVM each time. Compared with writing "0" or "1" for all bits into the NVM at one time, the 8-bit write pattern has better flexibility and compatibility and can be applicable to more application scenarios. For example, when some data in the NVM needs to be sanitized and some data needs to be reserved, the sanitize operation may be performed using the 8-bit write pattern.

If the host cannot determine a type of the NVM, the host may instruct the NVDIMM controller to write information into the NVM using a vendor-specific write pattern of the NVM. In this case, the first write pattern is the vendor-specific write pattern.

Table 1 shows the command code in the NVDIMM-P protocol for the DDR5 interface, and Table 2 shows the command code in the NVDIMM-P protocol for the DDR4 interface. The NVDIMM-P protocol for the DDR5 interface may also be referred to as the DDR5 NVDIMM-P protocol, and the NVDIMM-P protocol for the DDR4 interface may also be referred to as the DDR4 NVDIMM-P protocol.

TABLE 1

|  | CA0 | CA1 | CA2 | CA3 | CA4 |
|---|---|---|---|---|---|
| RFU # 0 | H | H | L | L | L |
| RFU # 1 | H | H | L | L | H |
| RFU # 2 | H | H | L | H | L |
| RFU # 3 | H | H | L | H | H |
| RFU # 4 | H | H | H | L | L |

TABLE 2

| Function | ACT_n | RAS_n/A16 | CAS_n/A15 | WE_n/A14 | A17 | A12/BC_n | A13 | A11 |
|---|---|---|---|---|---|---|---|---|
| FLUSH | H | L | H | H | H | H | L | H |
| IOP | H | L | H | H | H | L | H | H |
| RFU | H | L | H | H | H | H | H | H |
| RFU | H | L | H | H | H | H | H | L |
| RFU | H | L | H | H | H | H | L | L |
| RFU | H | L | H | H | H | L | H | L |
| RFU | H | L | H | H | H | L | L | H |
| RFU | H | L | H | H | H | L | L | L |
| RFU | H | L | H | H | L | H | H | H |
| RFU | H | L | H | H | L | H | H | L |
| RFU | H | L | H | H | L | H | L | H |
| RFU | H | L | H | H | L | H | L | L |
| RFU | H | L | H | H | L | L | H | H |
| RFU | H | L | H | H | L | L | H | L |
| RFU | H | L | H | H | L | L | L | L |

In Table 1 and Table 2, "H" indicates a high level, and "L" indicates a low level. In other tables of this application, meanings of "H" and "L" are the same as meanings of "H" and "L" in Table 1 and Table 2.

In addition, a CA in Table 1 indicates a command address, and an RFU indicates a reserved bit in a data write or read instruction. In Table 2, ACT_n, RAS_n/A16, CAS_n/A15, WE_n/A14, A17, A12/BC_n, A13, and A11 indicate location identifiers of bits in the data read or write instruction, respectively. FLUSH indicates that data from a cache and data from a buffer of the NVDIMM are written into the NVM, and input/output period (IOP) indicates that a period of time is left for the NVDIMM controller to perform an internal operation of the NVDIMM. Table 1 and Table 2 both indicate command codes that may be used in the sanitize command.

It needs to be noted that Table 1 and Table 2 merely show some bits in the sanitize command, and the sanitize command in S201 may further include other information.

The following further describes examples of possible sanitize commands.

TABLE 3

|  | Sanitize |  |
|---|---|---|
| CKE_0 | Previous | H |
|  | Current | H |
| CS_n |  | L |
| ACT_n |  | H |
| RAS_n/A16 |  | L |
| CAS_n/A15 |  | H |
| WE_n/A14 |  | H |
| C0-C2 |  | RFU |
| BG0-BG1 |  |  |
| BA0-BA1 |  |  |
| A17 |  | H |
| A12/BC_n |  | H |
| A13 |  | H |
| A11 |  | H |
| A10/AP |  | ERASE[1:0] |
| A9 |  |  |
| A8 |  | RFU |
| A0-A7 |  | PATTERN |

In Table 3, a sanitize command is the sanitize command received by the NVDIMM controller from the host. ERASE [1:0] represents four write patterns indicated by four statuses of bits "1" and "0". PATTERN indicates specific content of a write pattern, for example, indicates 8-bit "00000000" or 8-bit "11111111".

Table 4 shows a specific meaning of ERASE[1:0].

TABLE 4

| ERASE[1:0] | Meaning |
|---|---|
| 00 | Write "0" to all NVDIMM-P bit positions |
| 01 | Write "1" to all NVDIMM-P bit positions |
| 10 | 8-bit write pattern sent with the sanitize command (on $2^{nd}$ clock) |
| 11 | 8-bit write pattern specific to NVDIMM-P vendor |

Table 4 is merely an example for description. There may be another correspondence between the four statuses of ERASE[1:0] and the four write patterns. For example, "00" indicates that "1" is written to all NVDIMM-P bit positions, and "01" indicates that "0" is written to all NVDIMM-P bit positions. In Table 4, "on $2^{nd}$ clock" represents a second clock cycle of a command bus.

Table 3 shows a possible sanitize command in the NVDIMM-P protocol for the DDR4 interface. The following describes another example of a possible sanitize command in the NVDIMM-P protocol for the DDR5 interface.

TABLE 5

|  |  | Sanitize |  |
|---|---|---|---|
| CS |  | L | H |
| Command/address signal clock rising edge (Command/Address Signal Rising CLK_t) | CA0 | H | PATTERN[7:4] |
|  | CA1 | L |  |
|  | CA2 | L |  |
|  | CA3 | H |  |
|  | CA4 | L | RFU |
|  | CA5 | ERASE[1:0] |  |
|  | CA6 |  |  |
| Command/address signal clock falling edge (Command/Address Signal Falling CLK_t) | CA0 | RFU | PATTERN[3:0] |
|  | CA1 |  |  |
|  | CA2 |  |  |
|  | CA3 |  |  |
|  | CA4 |  | RFU |
|  | CA5 |  |  |
|  | CA6 |  |  |

A meaning of ERASE[1:0] in Table 5 is shown in Table 6. A sanitize command in Table 5 is the sanitize command received by the NVDIMM controller from the host. PATTERN[7:4] and PATTERN[3:0] indicate write patterns, namely, specific bits of the information written into the NVM.

TABLE 6

| ERASE[1:0] | Meaning |
|---|---|
| 00 | Write "0" to all NVDIMM-P bit positions |
| 01 | Write "1" to all NVDIMM-P bit positions |
| 10 | 8-bit write pattern sent with the sanitize command (on $2^{nd}$ clock) |
| 11 | 8-bit write pattern stored in an MR48 |

Table 6 is merely an example for description. There may be another correspondence between four statuses of ERASE [1:0] and four write patterns. For example, "00" indicates that "1" is written to all NVDIMM-P bit positions, and "01" indicates that "0" is written to all NVDIMM-P bit positions. The mode register (MR) 48 (MR48) indicates a mode register 48 in the NVDIMM controller, and the write pattern may also be stored in another MR in the NVDIMM controller.

After receiving the sanitize command from the host, the NVDIMM controller may start an internal sanitize mechanism to perform the sanitize operation, namely, write information into the NVM.

The foregoing describes an information writing method provided in this application, and describes some possible sanitize commands. It should be understood that all the foregoing embodiments are examples for description, and this is not limited to the information writing method provided in this application. The following describes another information writing method provided in this application. In the following method, a host triggers, by writing a MR, an NVDIMM controller to perform a sanitize operation.

In the method for triggering, by writing the MR, the NVDIMM controller to perform the sanitize operation, the host first sends a command to the MR. In the command, a bit in the MR is set, to trigger the NVDIMM controller to perform the sanitize operation. When the NVDIMM controller reads the bit in the MR, the NVDIMM controller can perform the sanitize operation.

The host may send the command to the MR using a command bus, to avoid a problem in other approaches that the host cannot access another memory module because the host writes a register using an inter-integrated circuit (I2C) interface.

TABLE 7

|  | Mode register set (MRS) |  |
|---|---|---|
| CKE_0 | Previous | H |
|  | Current | H |
| CS_n |  | L |
| ACT_n |  | H |
| RAS_n/A16 |  | L |
| CAS_n/A15 |  | L |
| WE_n/A14 |  | L |
| C0-C2 |  | V |
| BG0-BG1 |  | V |
| BA0-BA1 |  | V |
| A17 |  | Operation code (OPCODE) |
| A12/BC_n |  |  |
| A13 |  |  |
| A11 |  |  |

TABLE 7-continued

Mode register set (MRS)

A10/AP
A9
A8
A0-A7

In Table 7, the MRS is the command sent by the host to the MR on a DDR4 interface. V indicates Valid. In other words, this bit is valid, regardless of whether a signal level is high or low. OPCODE indicates an operation code. CKE0, CS_n, ACT_n, RAS_n/A16, CAS_n/A15, WE_n/A14, C0_C2, BG0_BG1, BA0_BA1, A17, A12/BC_n, A13, A11, A10/AP, A9, A8, and A0_A7 indicate location identifiers of bits in a data read or write instruction. The host may indicate, using an idle bit of the OPCODE in Table 7, whether to perform the sanitize operation. The OPCODE is further used to indicate a specific value to be written into the register.

TABLE 8

| Function | Register type | Operand | Data |
|---|---|---|---|
| Sanitize entry | W | OP[0] | 0: Normal operation<br>1: Enter sanitize mode |
| Sanitizing status | R | OP[1] | 0: Complete<br>1: In progress |
| RFU | TBD | OP[7:2] | |

Table 8 shows a command sent to an MR50 on a DDR5 interface. The host may write, using a mode register write (MRW) command, an OP bit of the sanitize entry function shown in Table 8, to instruct the NVDIMM controller to enter the sanitize mode. The NVDIMM controller may indicate a current sanitizing status by updating an OP bit of the sanitizing status function. W represents "writable", R represents "read-only", and TBD represents "to be defined".

The NVDIMM controller may receive a sanitize command using a side bus or a command bus. The side bus is an I2C interface and is controlled by software. The command bus is controlled by hardware (such as a memory controller). The NVDIMM controller may receive a first sanitize command from the host using the command bus, and the reception of the first sanitize command using the command bus does not affect access of the memory controller to another memory module. Therefore, in an optional embodiment, the receiving, by an NVDIMM controller, a sanitize command from a host includes the following step.

S203. The NVDIMM controller receives a first sanitize command from the host using a command bus.

Because an error may occur when the NVDIMM performs the sanitize operation, the host needs to monitor a process of the sanitize operation of the NVDIMM. In other words, the host needs to track execution of the sanitize command. In an optional embodiment, the method 200 further includes the following step.

S204. The NVDIMM controller sets a sanitizing status to a readable state, where the readable state indicates that the host is allowed to track execution of the sanitize command.

The following describes several embodiments in which the execution of the sanitize command is tracked.

TABLE 9

| Address | Operation mode | Description |
|---|---|---|
| BG0, BA1:BA0 | MR select | 000 = MR0, 001 = MR1, 010 = MR2, 011 = MR3, 100 = MR4, 101 = MR5, 110 = MR6, 111 = RCW |
| A2 | MPR operation | 0 = Normal, 1 = Dataflow from/to MPR<br>(0 = Normal, 1 = Dataflow from/to MPR) |

As shown in Table 9, the host first sends a command to an address (BG0, BA1:BA0) to select an MR. For example, an MR5 may be selected, and an A10 bit in the MR5 is set to 1 such that the NVDIMM enters a sanitize mode. Then, the host may select an MR3, and enable an A[2] bit in the MR3. In other words, the host sets the sanitizing status to the readable state. Next, a memory controller of the host can read an MPR page 2. The MPR indicates a multipurpose register, and the MPR is located in the NVM. The memory controller may read MPR0[7] on the MPR Page 2 using an MPR read command. A location of MPR0[7] on the MPR Page 2 is shown in Table 10. When the sanitizing status is "1", it indicates that a sanitize operation is in progress inside the NVDIMM. When the sanitizing status is "0", it indicates that a sanitize operation is completed inside the NVDIMM. Alternatively, "0" may be used to indicate that the sanitize operation is in progress inside the NVDIMM, and "1" may be used to indicate that the sanitize operation is completed inside the NVDIMM.

TABLE 10

| Address | MPR location | [7] | [6] | [5] | [4] | [3] | [2] | [1] | [0] | Note |
|---|---|---|---|---|---|---|---|---|---|---|
| BA1:BA0 | 00 = MPR0 | Sanitizing status | RFU<br>MR2<br>A11 | RFU | RFU<br>MR2<br>A12 | | RFU<br>A10 | | RFU<br>MR2<br>A9 | Read-only |
| | 01 = MPR1 | VrefDQ<br>Trng range<br>MR6<br>A6 | Vref DQ training value |  |  | MR3 |  |  | Gear-down<br>Enable<br>MR3 | |
| | | | A5 | A4 | A3 | A2 | A1 | A0 | A3 | |
| | 10 = MPR2 | | tSEND<br>MR0<br>A5 | | | | | | CAS write latency<br>MR2 | |
| | | A6 | | A4 | A2 | | A5 | A4 | A3 | |
| | 11 = MPR3 | | Rtt_Nom<br>MR1 | | | Rtt_Park<br>MR5 | | | Driver impedance<br>MR1 | |
| | | A10 | A9 | | A6 | A8 | A7 | A6 | A2 A1 | |

TABLE 11

| Address | Operation mode | Description |
|---|---|---|
| BG1 | RFU | 0 = Must be programmed to 0 during MRS |
| BG0, BA1:BA0 | MR select | 000 = MR0, 001 = MR1, 010 = MR2, 011 = MR3, 100 = MR4, 101 = MR5, 110 = MR6, 111 = RCW |
| A17:11 | RFU | 0 = Must be programmed to 0 during MRS |
| A10 | Sanitize entry (sanitize entry) | 0: Normal operation (default) 1: Enter sanitize mode |
| A9 | CA parity persistent error | 0 = Disable, 1 = Enable |
| A8:6 | RTT_PARK | |
| A5 | ODT input buffer during power down mode | 0 = ODT input buffer is activated, 1 = ODT input buffer is deactivated |
| A4 | CA parity error status | 0 = Clear, 1 = Error |
| A3 | Write link error clear | 0 = Clear, 1 = Error |
| A2:0 | C/A parity latency mode | |

The foregoing embodiments are applicable when the host tracks the execution of the sanitize command using the DDR4 interface. Because the host may track the status of the sanitize operation directly using a mode register read (MRR) command in the NVDIMM-P protocol for the DDR5 interface, the NVDIMM controller does not need to set the sanitizing status. If the host tracks the execution of the sanitize command using the DDR5 interface, the host may track the execution of the sanitize command by reading the OP bit of the sanitizing status in Table 8.

If the host encounters an error or another situation in a process of tracking the execution of the sanitize command, the host may instruct the NVDIMM controller to abort the sanitize operation. The following describes in detail how to abort the sanitize operation.

To ensure that the sanitize operation does not cause a problem such as a data loss or a CPU execution error, the host needs to wait until no uncompleted request exists in the NVDIMM. In a waiting period, the host can send a send command to the NVDIMM controller.

The host may determine, using the following method, that the NVDIMM has finished all requests.

In an optional embodiment, before the receiving, by an NVDIMM controller, a sanitize command from a host, the method 200 further includes the following steps.

S205. The NVDIMM controller receives a first check command from the host, where the first check command is used to instruct the NVDIMM controller to check whether an uncompleted read and/or write request exists in a buffer.

S206. The NVDIMM controller checks the buffer according to the first check command.

S207. The NVDIMM controller sends a first check result to the host, where the first check result is used to indicate that no uncompleted read and/or write request exists in the buffer.

S208. The NVDIMM controller receives a second check command from the host, where the second check command is used to instruct the NVDIMM controller to check whether an uncompleted write request exists in a controller of the NVM.

S209. The NVDIMM controller checks the controller of the NVM according to the second check command.

S210. The NVDIMM controller sends a second check result to the host, where the second check result is used to indicate that no uncompleted write request exists in the controller of the NVM.

There is no sequence between S205 and S208. Correspondingly, there is no sequence between S206 and S209, and there is no sequence between S207 and S210, either.

The NVDIMM controller can perform the sanitize operation only when no uncompleted requests exist in both the buffer and the controller of the NVM.

FIG. 3 shows a method for preparing a sanitize operation according to this application.

When a memory controller receives a sanitize request from a processor, the memory controller first needs to wait until requests sent to an NVDIMM are completed. The requests sent by the memory controller to the NVDIMM include XREAD, PWRITE, and FLUSH. To complete these requests, the memory controller may send a send command to the NVDIMM such that the NVDIMM feeds back processing results of the requests to the memory controller. The memory controller also needs to set a write credit counter to a maximum value.

Next, the memory controller sends a read_status (READ_STATUS) command to the NVDIMM, to instruct the NVDIMM controller to check a buffer, and determines, based on a result returned by the NVDIMM controller, whether a value of an available write credit (AWC) are equal to an initial write credit (WC) value. If the AWC value is not equal to the initial WC value, it indicates that an uncompleted WRITE and/or PWRITE request still exists in the buffer. In this case, the memory controller returns to the previous step and continues to wait.

Then, the memory controller sends a read_status (READ_STATUS) command again to the NVDIMM, to instruct the NVDIMM controller to check a controller of an NVM, that is, to check a write group identification (WGID) bitmap. The WGID bitmap includes an identifier of an uncompleted PWRITE. The memory controller determines, based on a result returned by the NVDIMM controller, whether an uncompleted PWRITE still exists in the controller of the NVM. If the uncompleted PWRITE still exists, it indicates that the send command previously sent by the memory controller may be lost. In this case, the memory controller returns to the previous step and continues to wait.

Alternatively, the memory controller may first instruct the NVDIMM controller to check the WGID bitmap, and then instruct the NVDIMM controller to check the buffer. In any case, the memory controller ultimately needs to wait until no uncompleted command exists in the NVDIMM. Then, the memory controller can initialize the sanitize operation, namely, send a sanitize command to the NVDIMM controller.

As mentioned above, if the host encounters an error or another situation in a process of tracking execution of the sanitize command, the host may instruct the NVDIMM to abort the sanitize operation. The following describes two embodiments in which the NVDIMM aborts the sanitize operation.

Figure 4:
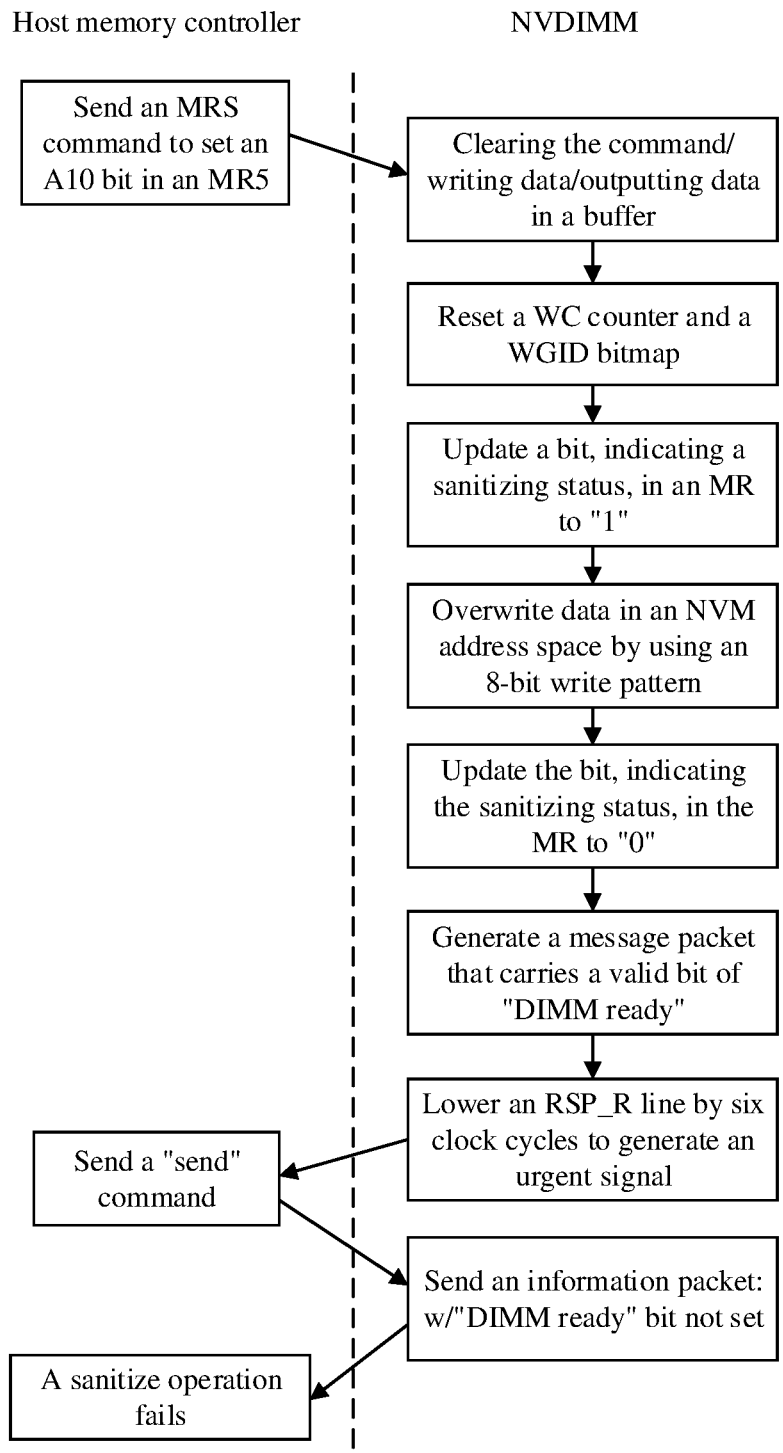
FIG. 4 is a schematic flowchart of a method for abortion of a sanitize operation applicable to the DDR4 NVDIMM-P protocol.

As shown in FIG. 4, a memory controller of a host sends an MRS command to update an A10 bit in an MR5 (DDR4 NVDIMM), and an NVDIMM performs a sanitize operation according to the command. The sanitize operation includes clearing the command/writing data/outputting data in a buffer, resetting a WC counter and a WGID bitmap, updating a bit, indicating a sanitizing status, in an MR to "1", to indicate that the sanitize operation is in progress, overwriting data in an NVM address space using an 8-bit write pattern, updating the bit, indicating the sanitizing status, in the MR to "0", to indicate that the sanitize operation is completed, generating an message packet that carries a valid bit of "DIMM ready", where the valid bit of "DIMM ready" is "1" if abortion is successful, or the valid bit of "DIMM ready" is "0" if the abortion fails, lowering an RSP_R line by six clock cycles to generate an urgent signal, and sending the urgent signal to the memory controller, receiving a send command sent by the memory controller, and returning, according to the send command, the message packet that carries w/"DIMM ready". The host may try to abort the sanitize operation a maximum of HOST_MAX_OPERATION_RETRY times.

Figure 5:
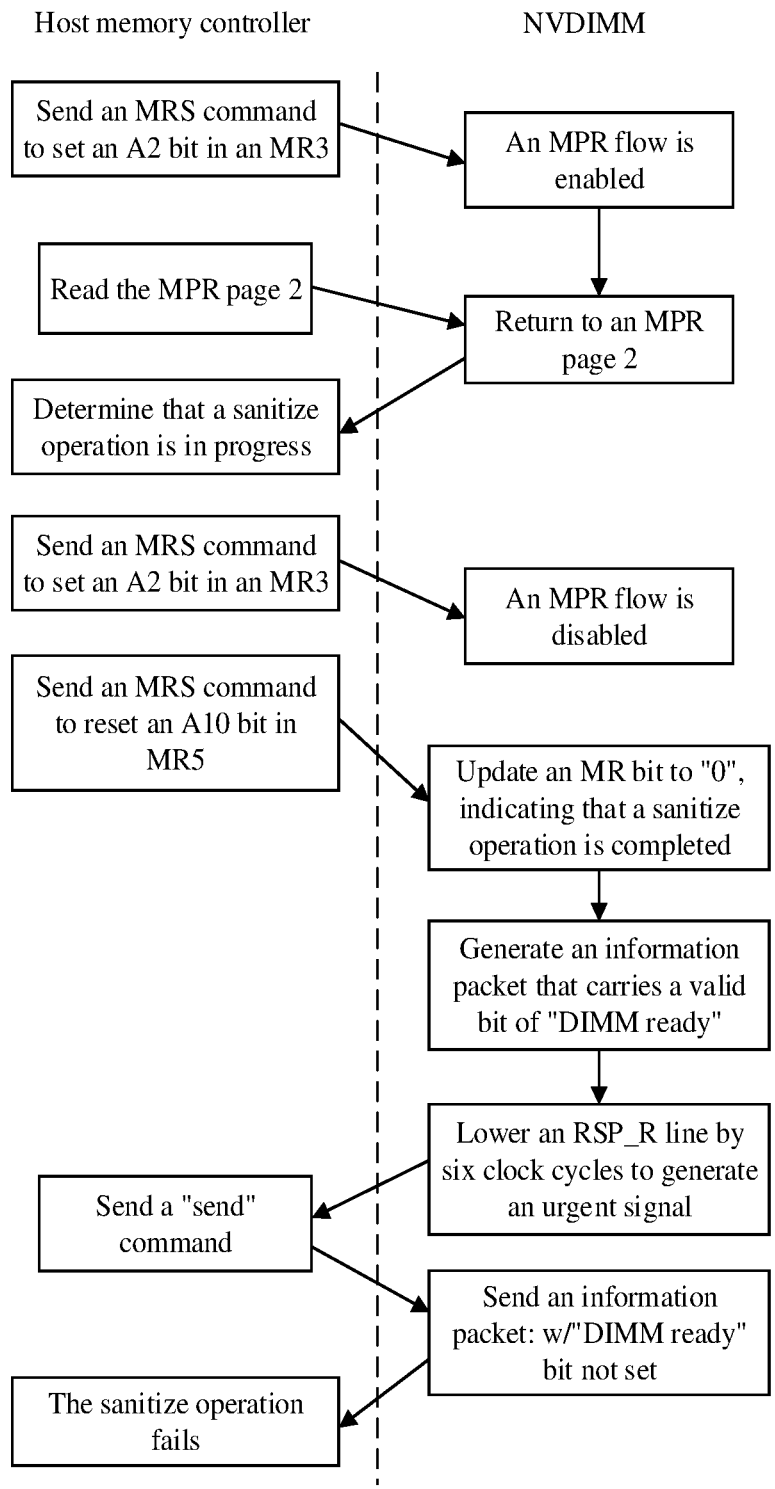
FIG. 5 is a schematic flowchart of a method for abortion of a sanitize operation applicable to the DDR5 NVDIMM-P protocol.

FIG. 5 is a flowchart of a method for abortion of a sanitize operation applicable to the DDR5 NVDIMM-P protocol. It can be learned from FIG. 5 that a memory controller of a host queries an MPR flow by sending an MRS command. When the MPR flow is enabled, an NVDIMM returns an MPR page 2 according to a received MPR read command. When the MPR flow is disabled, the NVDIMM does not return any information. The memory controller of the host may determine, when the MPR page 2 is not received, that a problem occurs during the sanitize operation, and determine to abort the sanitize operation. The memory controller resets an A10 bit in an MR5 by sending an MRS command. The NVDIMM updates, according to an indication of the A10 bit in the MRS, an MR bit indicating that the sanitize operation is completed, prepares an message packet that carries a valid bit of "DIMM ready", where the valid bit of "DIMM ready" is "1" if the abortion is successful, or the valid bit of "DIMM ready" is "0" if the abortion fails, lowers an RSP_R line by six clock cycles to generate an urgent signal, and sends the urgent signal to the memory controller, receives a send command sent by the memory controller, and returns, according to the send command, the message packet that carries w/"DIMM ready". The host may try to abort the sanitize operation a maximum of HOST_MAX_OPERATION_RETRY times.

Figure 6:
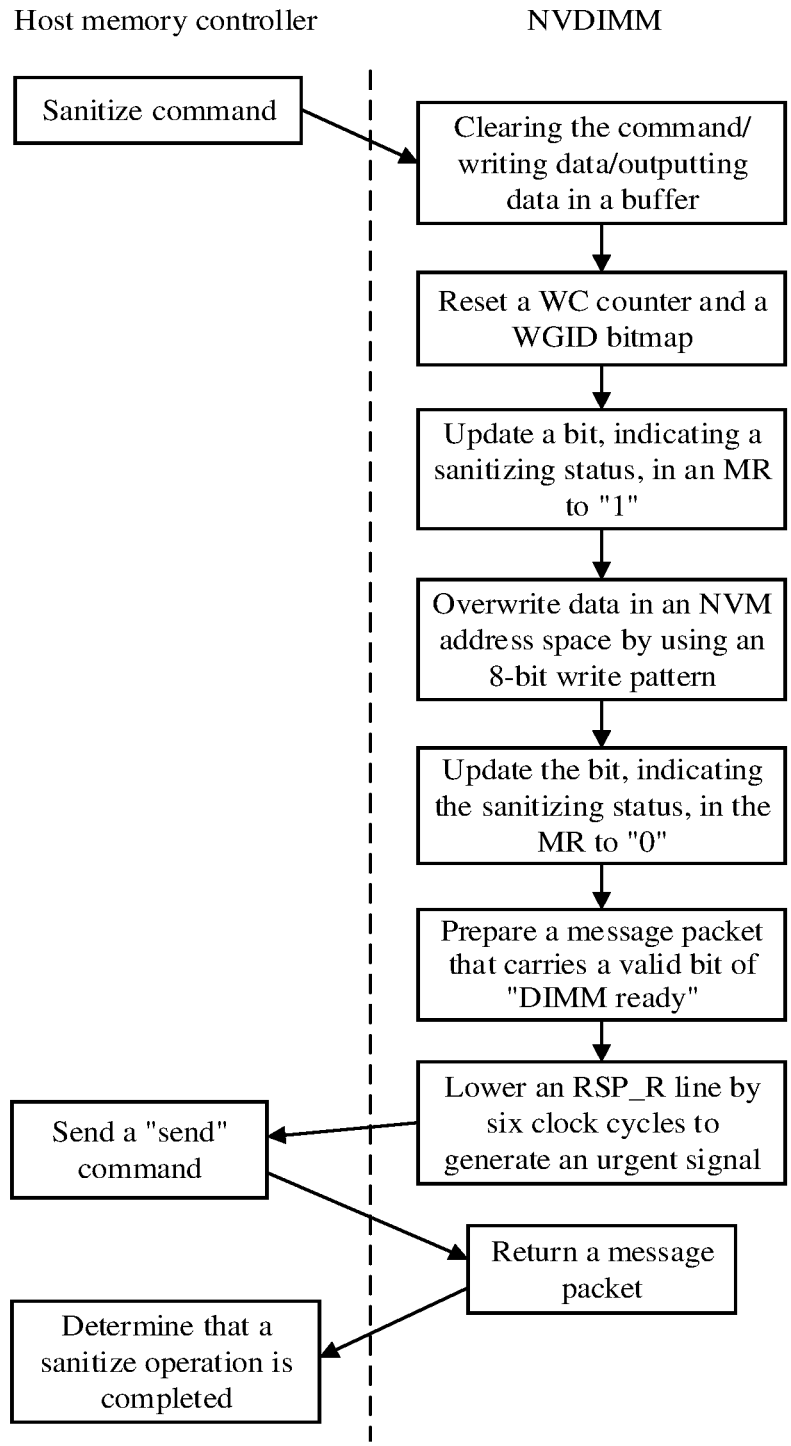
FIG. 6 is a flowchart of a sanitize operation on a DDR4 interface or a DDR5 interface according to this application.

FIG. 6 is a flowchart of a sanitize operation on a DDR4 interface or a DDR5 interface according to this application.

Figure 7:
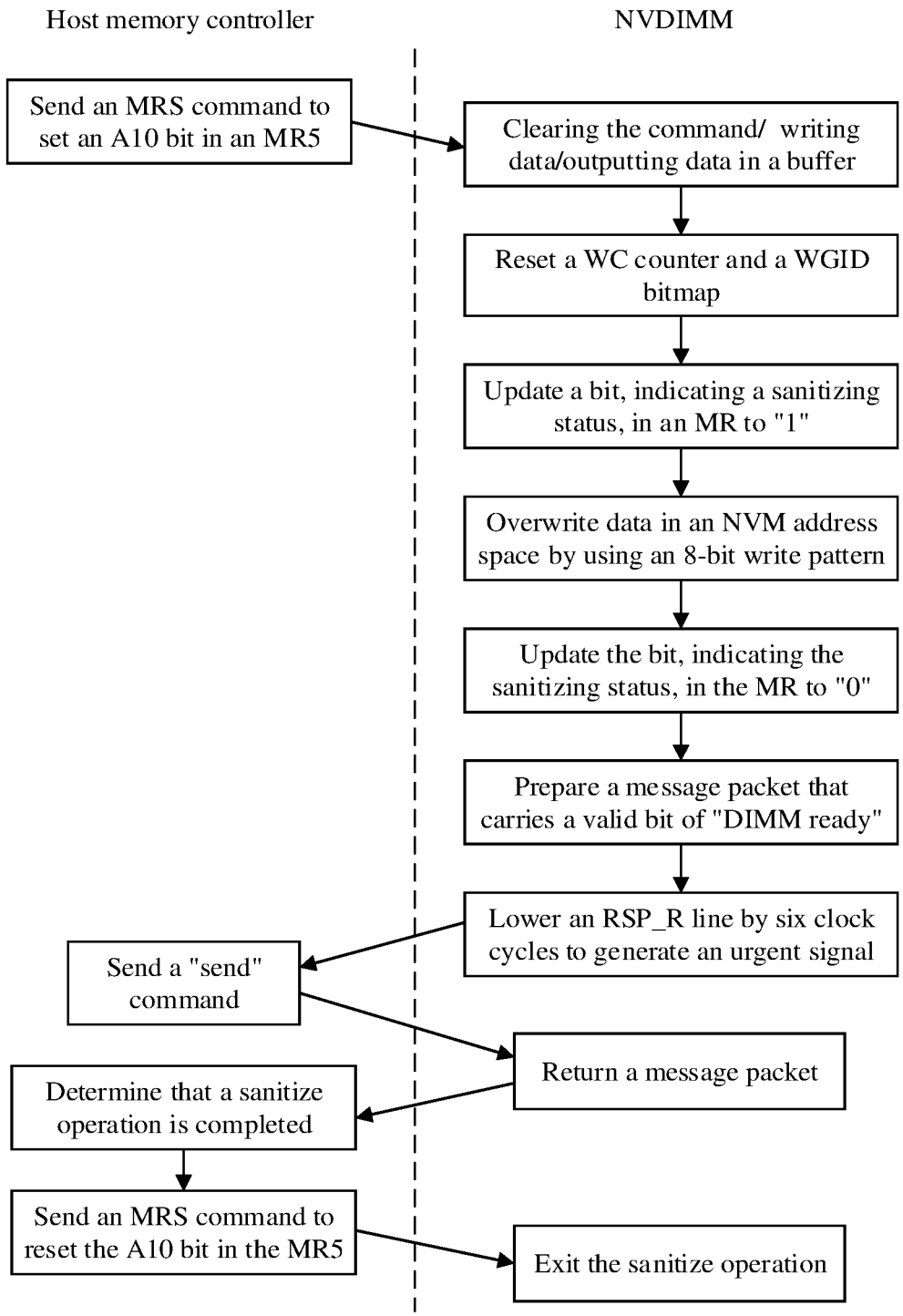
FIG. 7 is a flowchart of another sanitize operation on a DDR4 interface according to this application.

FIG. 7 is a flowchart of another sanitize operation on a DDR4 interface according to this application.

Figure 8:
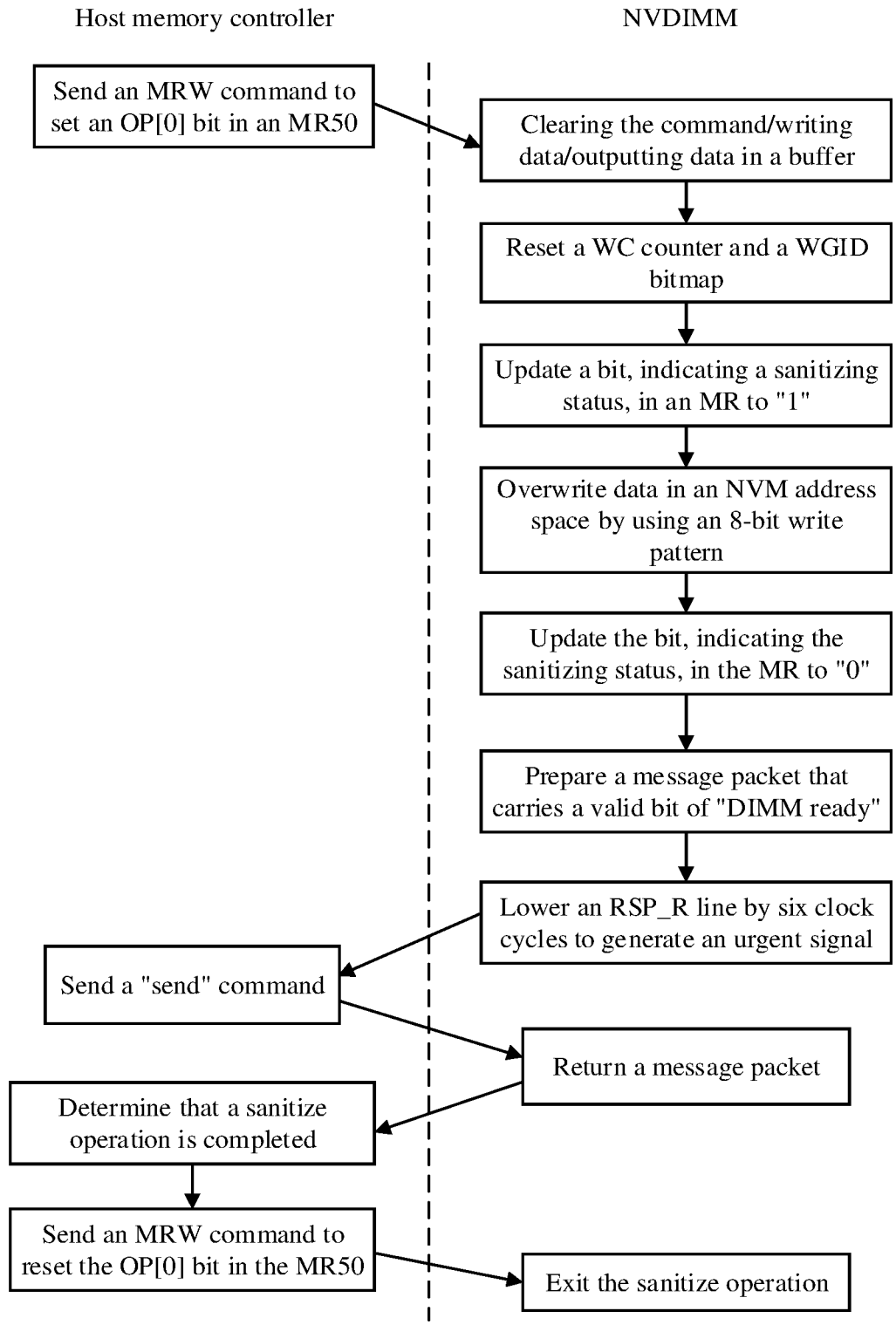
FIG. 8 is a flowchart of another sanitize operation on a DDR5 interface according to this application.

FIG. 8 is a flowchart of another sanitize operation on a DDR5 interface according to this application.

In the embodiments of this application, sequence numbers of processes do not mean execution sequences. The execution sequences of the processes should be determined based on functions and internal logic of the processes, and should not be construed as any limitation to the implementation processes of this application.

In addition, the term "and/or" in this specification is used to describe only an association relationship between associated objects and indicates that three relationships may exist. For example, A and/or B may indicate the following three cases. Only A exists, both A and B exist, and only B exists. In addition, the character "/" in this specification generally indicates an "or" relationship between the associated objects.

In the foregoing specific embodiments, the objectives, technical solutions, and beneficial effects of this application are further described in detail. It should be understood that the foregoing descriptions are merely specific embodiments of this application, but are not intended to limit the protection scope of this application. Any modification, equivalent replacement, improvement, or the like made based on the technical solutions of this application should fall within the protection scope of this application.

What is claimed is:

1. An information writing method, implemented by a non-volatile dual in-line memory module (NVDIMM), comprising:
   receiving a sanitize command from a host, wherein the sanitize command instructs an NVDIMM controller to sanitize data in a non-volatile memory (NVM) using a first write pattern, wherein the NVDIMM comprises the NVDIMM controller and the NVM, wherein the first write pattern is one of at least two patterns of writing information into the NVM, and wherein the sanitize command is in a NVDIMM-P protocol for either a dual data rate 5 (DDR5) interface or a double data rate 4 (DDR4) interface; and
   writing information into the NVM according to the sanitize command.

2. The information writing method of claim 1, wherein the first write pattern is a power-saving write pattern among the at least two patterns of writing information.

3. The information writing method of claim 1, wherein receiving the sanitize command from the host comprises receiving the sanitize command from the host using a command bus.

4. The information writing method of claim 1, further comprising setting a sanitizing status to a readable state, wherein the readable state indicates that the host is allowed to track execution of the sanitize command.

5. The information writing method of claim 1, further comprising:
   receiving a first check command from the host, wherein the first check command instructs the NVDIMM controller to check whether an uncompleted read request or an uncompleted write request exists in a buffer;
   checking the buffer according to the first check command;
   sending a first check result to the host, wherein the first check result indicates that no uncompleted read request or uncompleted write request exists in the buffer;
   receiving a second check command from the host, wherein the second check command instructs the NVDIMM controller to check whether an uncompleted write request exists in a controller of the NVM;
   checking the controller of the NVM according to the second check command; and
   sending a second check result to the host, wherein the second check result indicates that no uncompleted write request exists in the controller of the NVM.

6. The information writing method of claim 1, wherein the first write pattern comprises writing all bits to a "1" or writing all bit to a "0" based on a type of the NVM.

7. An information writing method performed by a host, wherein the information writing method comprises:
   generating a sanitize command, wherein the sanitize command instructs a non-volatile dual in-line memory module (NVDIMM) controller in a NVDIMM to sanitize data in a non-volatile memory (NVM) using a first write pattern, wherein the NVDIMM comprises the NVDIMM controller and the NVM, wherein the first write pattern is one of at least two patterns of writing information into the NVM, and wherein the sanitize command is in a NVDIMM-P protocol for either a dual data rate 5 (DDR5) interface or a double data rate 4 (DDR4) interface; and
   sending the sanitize command to the NVDIMM controller.

8. The information writing method of claim 7, wherein generating the sanitize command comprises generating the sanitize command based on a type of the NVM, and wherein the first write pattern is a power-saving write pattern among the at least two patterns of writing information.

9. The information writing method of claim 7, wherein sending the sanitize command to the NVDIMM controller comprises sending the sanitize command to the NVDIMM controller using a command bus.

10. The information writing method of claim 7, further comprising sending a tracking command to the NVDIMM controller, wherein the tracking command tracks execution of the sanitize command.

11. The information writing method of claim 7, further comprising:
sending a first check command to the NVDIMM controller, wherein the first check command instructs the NVDIMM controller to check whether an uncompleted read or write request exists in a buffer;
receiving a first check result from the NVDIMM controller, wherein the first check result indicates that no uncompleted read or write request exists in the buffer;
sending a second check command to the NVDIMM controller, wherein the second check command instructs the NVDIMM controller to check whether an uncompleted write request exists in a controller of the NVM;
receiving a second check result from the NVDIMM controller, wherein the second check result indicates that no uncompleted write request exists in the controller of the NVM; and
sending the sanitize command to the NVDIMM controller based on the first check result and the second check result.

12. The information writing method of claim 7, wherein the first write pattern comprises writing all bits to a "1" or writing all bit to a "0" based on a type of the NVM.

13. A non-volatile dual in-line memory module (NVDIMM), comprising:
a non-volatile memory (NVM); and
an NVDIMM controller coupled to the NVM and configured to:
receive a sanitize command from a host, wherein the sanitize command instructs the NVDIMM controller to sanitize data in the NVM using a first write pattern, wherein the first write pattern is one of at least two patterns of writing information into the NVM, and wherein the sanitize command is in a NVDIMM-P protocol for either a dual data rate 5 (DDR5) interface or a double data rate 4 (DDR4) interface; and
write information into the NVM according to the sanitize command.

14. The NVDIMM of the claim 13, wherein the first write pattern is a power-saving write pattern among the at least two patterns of writing information.

15. The NVDIMM of the claim 13, wherein the NVDIMM controller is configured to receive the sanitize command from the host using a command bus.

16. The NVDIMM of the claim 13, wherein the NVDIMM controller is further configured to set a sanitizing status to a readable state, and wherein the readable state indicates that the host is allowed to track execution of the sanitize command.

17. The NVDIMM of the claim 13, wherein the first write pattern comprises writing all bits to a "1" or writing all bit to a "0" based on a type of the NVM.

18. A computing system, comprising:
a non-volatile dual in-line memory module (NVDIMM) comprising an NVDIMM controller and a non-volatile memory (NVM); and
a processor coupled to the NVDIMM and configured to:
generate a sanitize command, wherein the sanitize command instructs the NVDIMM controller to sanitize data in the NVM using a first write pattern, wherein the first write pattern is one of at least two patterns of writing information into the NVM, and wherein the sanitize command is in a NVDIMM-P protocol for either a dual data rate 5 (DDR5) interface or a double data rate 4 (DDR4) interface; and
send the sanitize command to the NVDIMM controller.

19. The computing system of claim 18, wherein the processor is configured to generate the sanitize command based on a type of the NVM, and wherein the first write pattern is a power-saving write pattern among the at least two patterns of writing information.

20. The computing system of claim 18, wherein the first write pattern comprises writing all bits to a "1" or writing all bit to a "0" based on a type of the NVM.

* * * * *